(12) United States Patent
Sikora

(10) Patent No.: US 8,643,385 B2
(45) Date of Patent: Feb. 4, 2014

(54) METHOD FOR THE SIMULATION OF DEFECTS WITH SPARK TESTERS AND SPARK TESTERS

(75) Inventor: Harald Sikora, Bremen (DE)

(73) Assignee: Sikora AG, Bremen (DE)

( * ) Notice: Subject to any disclaimer, the term of this patent is extended or adjusted under 35 U.S.C. 154(b) by 379 days.

(21) Appl. No.: 13/074,082

(22) Filed: Mar. 29, 2011

(65) Prior Publication Data
US 2011/0241696 A1 Oct. 6, 2011

(30) Foreign Application Priority Data

Apr. 1, 2010 (DE) .......................... 10 2010 014 387

(51) Int. Cl.
H01H 31/12 (2006.01)
(52) U.S. Cl.
USPC .......................................... 324/551; 324/399
(58) Field of Classification Search
USPC .................. 324/378–384, 551, 555, 557, 399
See application file for complete search history.

(56) References Cited

U.S. PATENT DOCUMENTS 5,302,904 A * 4/1994 Nopper .......................... 324/536
2007/0273382 A1 * 11/2007 Schneider et al. ............. 324/388

FOREIGN PATENT DOCUMENTS

CN 1309773 8/2001
EP 0539900 5/1993

OTHER PUBLICATIONS

DIN En 62230 (VDE 0481-2230), Aug. 2008 (Only in German).

* cited by examiner

Primary Examiner — Vincent Q. Nguyen
(74) Attorney, Agent, or Firm — Vidas, Arrett & Steinkraus

(57) ABSTRACT

Method for the simulation of defects in the case of spark testers, in which breakdowns are recognized and displayed by a detector and added by means of a defect counter, wherein the high voltage is applied to a stationary standard spark gap and pulsed test voltages of predetermined level, duration and frequency are generated by the high voltage generator of the spark tester in short regular intervals.

12 Claims, 3 Drawing Sheets

METHOD FOR THE SIMULATION OF DEFECTS WITH SPARK TESTERS AND SPARK TESTERS

CROSS-REFERENCE TO RELATED APPLICATIONS

Not applicable

STATEMENT REGARDING FEDERALLY SPONSORED RESEARCH

Not applicable

BACKGROUND OF THE INVENTION

The invention relates to a method for the simulation of defects with spark testers, and a spark tester.

As is known, cables and insulated lines must have a predetermined breakdown resistance. For cables and insulated lines, spark tester devices have been available for a long time which test according to various standards the insulation of lines for insulation defects with the aid of a test voltage. There has also been a European standard, EN 50356, the entire contents of which are hereby incorporated by reference, for this purpose for years now, which describes and specifies the design of devices of this type as well as the various test voltages, and furthermore provides instructions on how the sensitivity regarding the recognition of defects in the insulation can be tested. A revised version of the European Standard is EN 62230:2007, the entire contents of which are hereby incorporated by reference. This standard is based on different test voltage forms: alternating voltages of 40 to 62 Hz, alternating voltage with virtually sinusoidal curve and a frequency between 500 Hz and 1 MHz or pulse voltage with a rapid rise and strongly damped fall. A spark tester must furthermore contain a display system that displays defects optically and/or acoustically when the insulation or the jacket of the cable due to faulty insulation or coating does not hold the specific test voltage and a breakdown to the grounded conductor occurs. The defect detector must trigger a digital counter such that each discrete defect is shown. It must also add the defects through to the end of the cable run. The counter must retain the display until the next defect is registered or the display is cleared manually.

For the sensitivity of the spark tester it is required that the defect display is tripped when an artificially generated defect is switched between the electrode and the ground. To this end it is known to provide a so-called defect simulator. It is to be adjusted such that for each simulated defect it generates a discharge in a spark gap of a duration of 0.025 seconds for alternating voltage and high-frequency voltage and of 0.0005 seconds for direct voltage. A sequence of at least 20 discharges of this type is to be triggered, wherein these should not have a time lag of more than one second. The sensitivity of the defect detector is adjusted such that no more and no less than one count pulse per provided discharge is registered.

A known defect simulator, with which the described requirements are met provides an insulation disk, driven by an electric motor via a transmission, which bears an electrode which is permanently at ground potential. A stationary needle electrode is arranged opposite the electrode, which stationary needle electrode is set at the test voltage. The distance between the needle electrode and the disk electrode is predetermined. The dimensions of the needle electrode are also predetermined (Annex B to EN 62230:2007).

The operator of a cable production plant who uses a spark tester device is therefore obligated to test the device from time to time with the aid of a simulator. It is recommended to carry out the assessment of the sensitivity at least once a year, as well as after the first installation and after every repair or major adjustment of the device.

The object of the invention is to disclose a method or a spark tester with which the expenditure for testing for reliability can be substantially reduced.

BRIEF SUMMARY OF THE INVENTION

In the method according to the invention according to claim 1, the high voltage for testing sensitivity of the defect detector is applied to a stationary standard spark gap of predetermined dimension, and the high voltage generator generates at short regular intervals a test voltage (test high voltage) of predetermined level, duration and frequency. If the simulation or test method conforms to the provisions of the EU Standard, the intervals between the points in time at which a test voltage is applied to the standard spark gap are no more than one second. The maximum duration for which the test voltage is applied is 0.025 seconds in the case of alternating current and high-frequency voltage and 0.0005 seconds in the case of direct current. The number of switchings of the test voltage is at least 20.

With the invention, instead of a mechanical application of the artificial spark gap, the spark tester itself is controlled such that the test voltage according to the standard is applied to a fixed spark gap. Through the measure according to the invention, the distance between the tip of the electrode to the counter electrode with the artificial spark gap can be adjusted once. It does not depend on any tolerances how it is produced, e.g., with the rotation of the known simulator. The additional expenditure that is necessary to equip a spark tester with a test function according to the invention is negligible. The checking measures listed in the EU standard regarding the precision of the test voltage and the maintenance of the maximum contact current can likewise be integrated with a small additional expenditure. A relatively expensive separate test device for testing a spark checker, as has been used hitherto, is thus unnecessary. In the invention the defect simulator together with an additional test voltage and short circuit current measurement is integrated into the spark tester.

A spark tester according to the invention has a spark gap with standard dimensions that can be connected to the test voltage of the high voltage generator as well as a clock generator, which switches on the high voltage generator with predetermined frequency and incidence and switches it off again respectively after a predetermined length of time. Preferably, a control is integrated in the high voltage generator, which controls the clock generator according to a stored program. In this manner a spark tester can test itself. The operator of a production plant does not need a separate test device.

BRIEF DESCRIPTION OF THE SEVERAL VIEWS OF THE DRAWINGS

The invention is explained in more detail below based on drawings.

FIG. 5 shows diagrammatically a spark gap for a defect simulator according to the invention.

DETAILED DESCRIPTION OF THE INVENTION

While this invention may be embodied in many different forms, there are described in detail herein a specific preferred embodiment of the invention. This description is an exemplification of the principles of the invention and is not intended to limit the invention to the particular embodiment illustrated.

Figure 3:
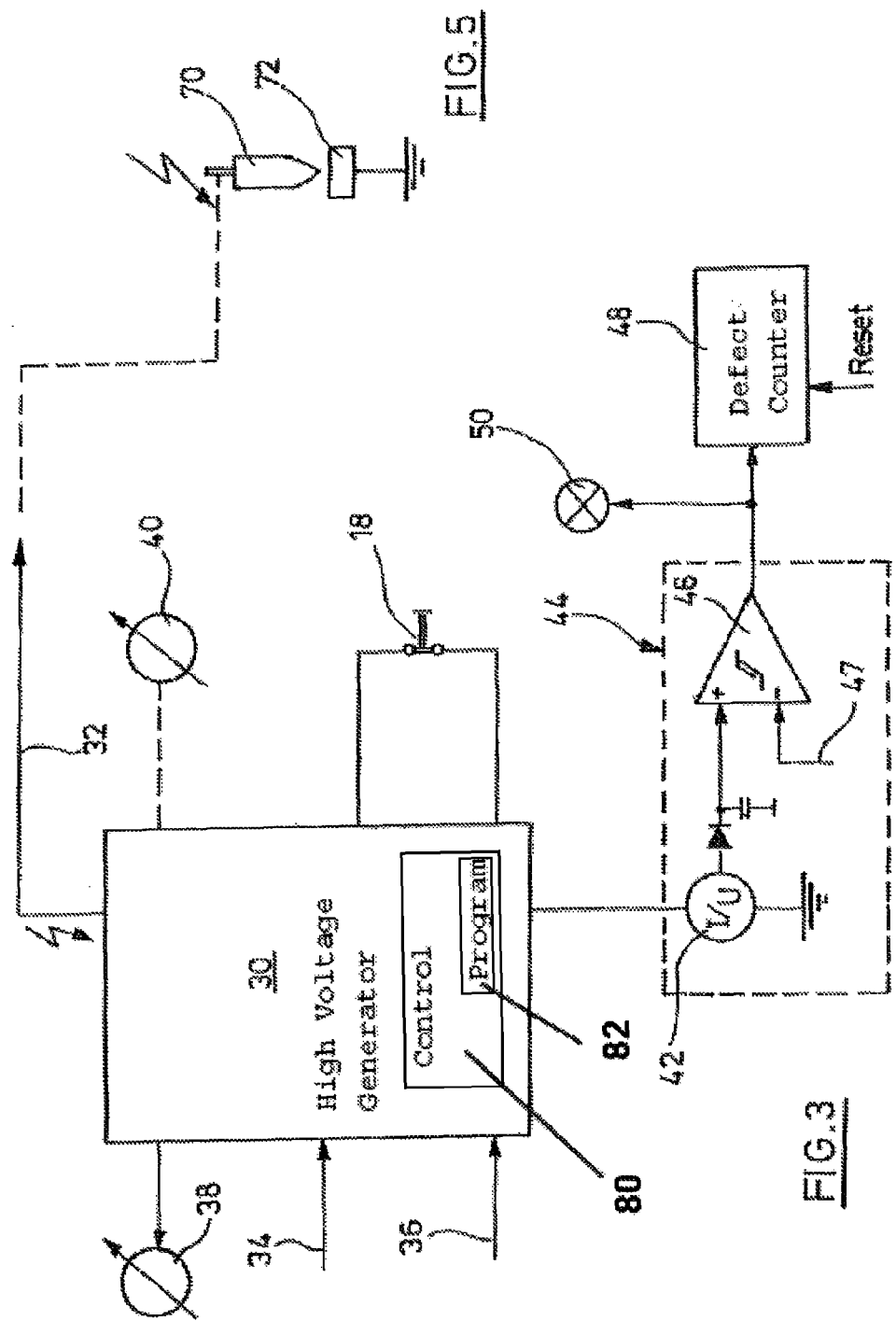
FIG. 3 shows a circuit diagram for the operation of the spark tester according to the invention.
Figure 4:
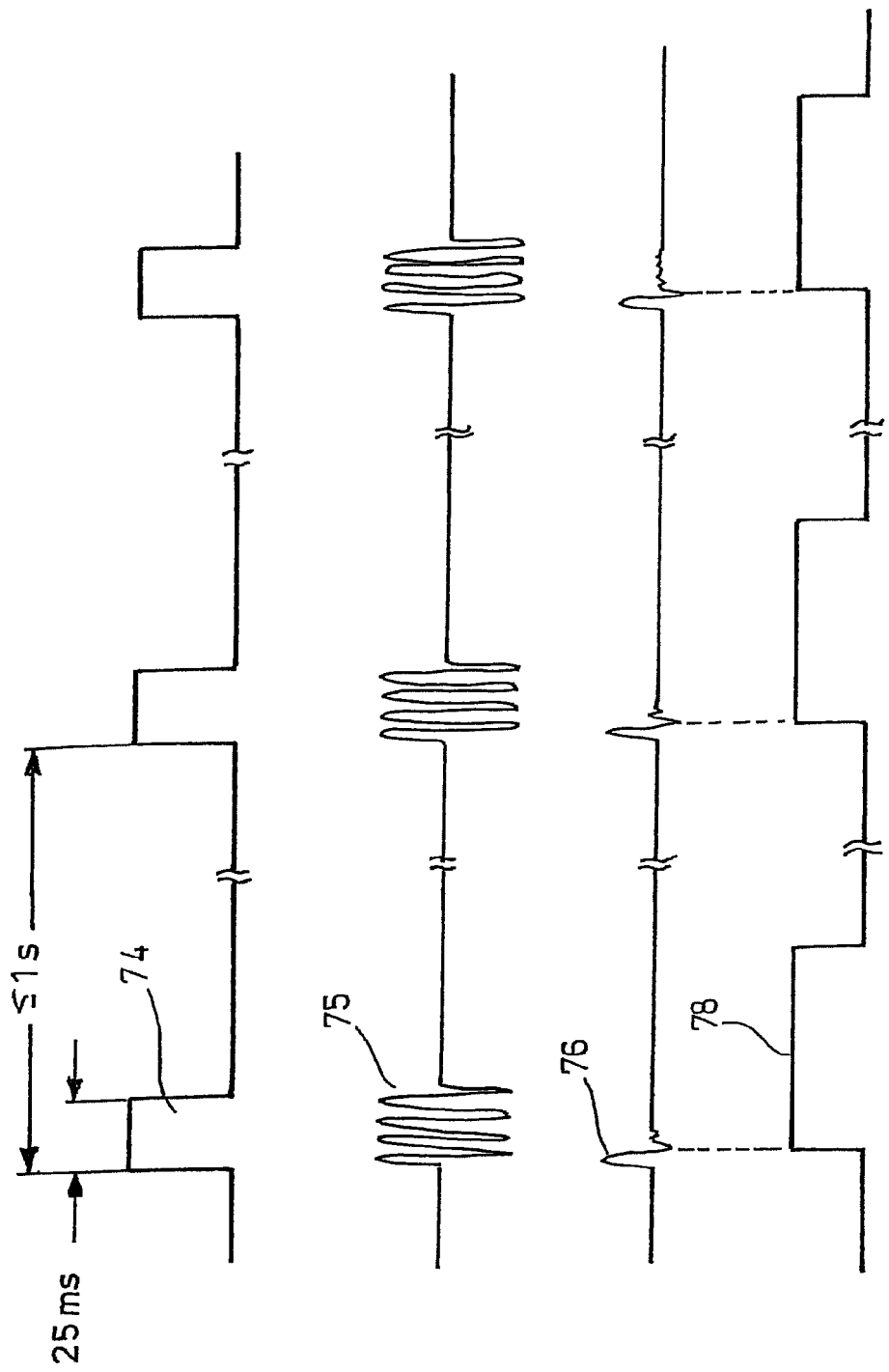
FIG. 4 shows different diagrams for the operation of a defect simulator according to the invention.

A housing 10, open at the ends, of a spark tester has an insulation plate 12 on which a hood 16 is articulated via a hinge 14. A safety switch shown at 18 opens when the hood 16 is opened, so that when reaching inside the hood there is no contact with high voltage. This is namely applied as test voltage to a test electrode 20, on which a number of parallel bead chains 22 are suspended. A cable 24 moves in a v-shaped recess of the test electrode 20 and through the curtain of the bead chains 22. The test electrode is connected to test voltage, as shown at 26. The conductor 29 of the cable, the insulation 28 of which is to be tested, is at ground potential. FIG. 3 shows diagrammatically the circuit layout for operating the spark tester according to FIG. 1. This includes a high voltage generator 30 with a safety current limitation to a maximum of 10 mA (maximum permissible contact current). Its high voltage is emitted at 32 as test voltage, for example, direct voltage, alternating voltage or high frequency voltage. It is applied to the electrode 20 in FIG. 1. At 34 a desired high voltage is specified for the high voltage generator 30. A trigger, as shown at 36, in the embodiment according to the invention permits the triggering of the test voltage 32, as shown in FIG. 4 first and second line. At 18 the safety switch according to FIG. 1 can be seen, which switches off the test voltage when the hood 16 is opened.

A display 38 for the actual value of the respective test voltage 32 is connected to the high voltage generator 30. At 40 an alternative display of the test voltage is shown, which in the embodiment according to the invention permits a check of the test voltage for its compliance with predetermined tolerances independent of the test voltage display 38. A current voltage converter 42 is connected to the generator 30. If a breakdown occurs in the insulation 28, this is signaled by a significant drop in the high voltage and a rise in the current. The current increase is determined in a detector 44, to which the current converter 42 belongs. These changes reach a defect counter 48 as well as a defect display 50 via a rectifier and a threshold switch 46. The sensitivity of the detector can be adjusted at 47.

Apart from the deviations according to the invention, a spark tester with the described features is known.

Figure 2:
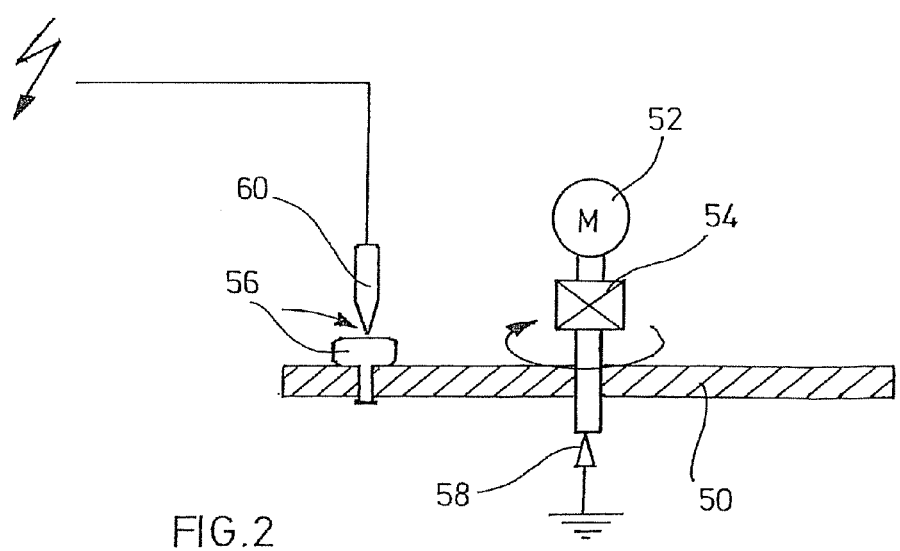
FIG. 2 shows diagrammatically a known defect simulator, e.g., for the spark tester according to FIG. 1.

FIG. 2 shows a defect simulator according to the prior art. An insulation disk 50 is driven rotating about a vertical axis with the aid of a drive motor 52 and a transmission 54. A first electrode 56 is located on the insulation disk 50 and, as shown at 58, is permanently at ground potential. A needle electrode 60 as counter electrode is aligned to the circle that the plate electrode 56 traces with the rotation of the disk 50. The test voltage is applied to the electrode 60, and as soon as the electrode 60 is opposite the electrode 56, a spark is generated. Since the test voltage at the electrode 60 comes from the generator 30, a defect is simulated for the detector 44 in this manner according to FIG. 3. It can therefore be established whether the detector is operating correctly when the defect simulator is operated according to the standard, i.e., a predetermined rpm and speed of the rotating insulation disk is maintained and the distance of the electrodes 60, 56 from one another and the shaping of the needle electrode 60 are in compliance with the standard.

FIG. 5 shows a needle electrode 70 that lies opposite the plate electrode 72. The embodiment of the electrodes 70, 72 corresponds to that of electrodes 56, 60 according to FIG. 2. This also relates to the distance of the electrodes 70, 72 from one another. Both of the electrodes 70, 72 are stationary. With the aid of a clock generator, not shown in FIG. 3, at 36 the test voltage of the generator 30 according to FIG. 3 is switched on and off. In the top diagram of FIG. 4 it can be seen that at an interval of no more than one second turn-on pulses 74 having a duration of 25 ms are generated. The test voltage shown is applied at the electrode 70 according to FIG. 5 and in each case generates a spark. If the spark gap 70, 72 is not applied to the test voltage 32 of the generator 30, test voltage curves 75, as shown in the second diagram of FIG. 4, result. It can be seen that during the on period 74 an alternating high voltage is generated. However, if the spark gap 70, 72 is connected to the high voltage generator 30, breakdowns result, the test voltage breaks down to the arc voltage of the spark gap and a curve of the test voltage 76 results as is shown in the third diagram in FIG. 4. The recognized breakdowns cause defect signals, which are converted by the detector 44 into rectangular pulses, as is discernible in the last diagram in FIG. 4. The defect pulses are given on the defect counter 48 or the defect display 50. It is discernible that through targeted switching on and off of the high voltage generator and application of resulting test voltages to the spark gap, a defect simulation is rendered possible, which replaces a defect simulation according to FIG. 2. The triggering of the test voltage generator 30 can be part of the spark tester for the required curve of the high voltage, if the spark tester is modified accordingly, and does not require a separate device, as with the defect simulator according to FIG. 2. Through corresponding triggering of the switching on and off of the high voltage generator 30, for instance, according to a predetermined program, a self test of a spark tester can take place. It is established whether the predetermined number of simulated defects in the predetermined time also triggers the same number of defect messages, no more and no less.

Figure 1:
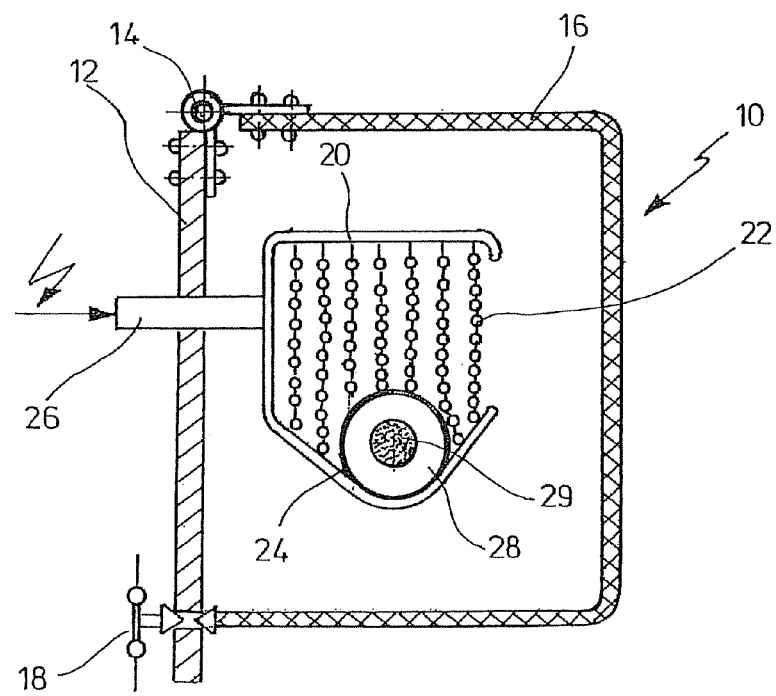
FIG. 1 shows diagrammatically a spark tester of known design.

Naturally, during the triggering of the spark gap according to FIG. 5, the normal test operation of the device according to FIG. 1 is interrupted. Therefore a switch—not shown—can be provided which connects the high voltage generator 30 optionally with the test electrode 20 or the spark gap.

The high voltage generator 30 may also have a control 80 integrated, which controls the clock generator according to a program 82 stored therein.

The above disclosure is intended to be illustrative and not exhaustive. This description will suggest many variations and alternatives to one of ordinary skill in this art. All these alternatives and variations are intended to be included within the scope of the claims where the term "comprising" means "including, but not limited to". Those familiar with the art may recognize other equivalents to the specific embodiments described herein which equivalents are also intended to be encompassed by the claims.

Further, the particular features presented in the dependent claims can be combined with each other in other manners within the scope of the invention such that the invention should be recognized as also specifically directed to other embodiments having any other possible combination of the features of the dependent claims. For instance, for purposes of claim publication, any dependent claim which follows should be taken as alternatively written in a multiple dependent form from all prior claims which possess all antecedents referenced in such dependent claim if such multiple dependent format is an accepted format within the jurisdiction (e.g. each claim depending directly from claim 1 should be alternatively taken as depending from all previous claims). In jurisdictions where multiple dependent claim formats are restricted, the following dependent claims should each be also taken as alternatively written in each singly dependent claim format which creates a dependency from a prior antecedent-possessing claim other than the specific claim listed in such dependent claim below.

This completes the description of the preferred and alternate embodiments of the invention. Those skilled in the art may recognize other equivalents to the specific embodiment described herein which equivalents are intended to be encompassed by the claims attached hereto.

What is claimed is:

1. A method for spark testing of cables, comprising the steps of:
    generating a relatively high test voltage with a high voltage generator;
    applying the relatively high test voltage to the insulation of the cable through at least one electrode passed by the cable, while the conductor of the cable is grounded;
    detecting sparks at the cable using a detector;
    counting the sparks using a counter, and
    generating pulse simulation test voltages at a predetermined level, duration and frequency using the high voltage generator and applying them to a stationary spark gap;
    detecting sparks at the spark gap using the detector and counting the sparks using the counter.

2. The method according to claim 1, characterized in that the interval between two consecutive pulse simulation test voltages has a duration of less than 1 second.

3. The method according to claim 1, characterized in that the maximum duration of the pulse simulation test voltages is 0.025 seconds in the case of alternating voltage or high frequency voltage or 0.0005 seconds in the case of direct voltage.

4. The method according to claim 1, characterized in that the number of pulse simulation test voltages is at least 20.

5. The method according to claim 1, characterized in that the precision of the test voltage is tested with the aid of an additional, independent high voltage measurement device.

6. The method according to claim 1, characterized in that a maximum permissible contact current is tested with the aid of an additional independent measurement device.

7. The method according to claim 1, characterized in that for testing reliability of the detection of defects the high voltage generator is controlled by a predetermined program in order to detect whether the number of detected sparks corresponds to the number of simulation test voltages generated at a predetermined time.

8. The method according to claim 1, characterized in that what is tested is whether the test voltages and/or the simulation test voltages correspond to predetermined values.

9. The method according to claim 1, characterized in that the contact current is measured.

10. A spark tester for cables comprising: at least one test electrode to be passed by the cable,
    a high voltage generator connected to the electrode and generating a test voltage to be applied to the cable, the conductor of which being grounded,
    a defect detector associated to the high voltage generator to detect sparks at the cable, and
    a counter connected to the defect detector in order to count the sparks,
    further wherein a stationary spark gap is also connectable to the high voltage generator, a clock generator being connected to and controlling the high voltage generator to generate simulation test voltages of predetermined level, duration and frequency, to be applied to the spark gap, the detector detecting and the counter counting the sparks of the spark gap.

11. Spark tester according to claim 10, characterized in that a control is integrated in the high voltage generator, which controls the clock generator according to a stored program.

12. A method for the simulation of defects with spark testers, comprising the steps of:
    applying a simulation test voltage with the aid of a high voltage generator via an electrode to a continuous cable;
    recognizing and displaying breakdowns using a detector;
    incrementing a defect counter, and
    wherein the simulation test voltage for testing the reliability of the recognition of defects are generated at a predetermined level, duration and frequency and applied to a fixed spark gap, and these test voltages are generated by the high voltage generator of the spark tester.

* * * * *